United States Patent
Brodsky et al.

(10) Patent No.: US 7,229,936 B2
(45) Date of Patent: Jun. 12, 2007

(54) METHOD TO REDUCE PHOTORESIST PATTERN COLLAPSE BY CONTROLLED SURFACE MICROROUGHENING

(75) Inventors: Colin J. Brodsky, Salt Point, NY (US); Scott J. Bukofsky, Hopewell Junction, NY (US); Dario L. Goldfarb, Mohegan Lake, NY (US); Scott D. Halle, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 256 days.

(21) Appl. No.: 10/709,406

(22) Filed: May 3, 2004

(65) Prior Publication Data

US 2005/0245094 A1 Nov. 3, 2005

(51) Int. Cl.
*H01L 21/31* (2006.01)

(52) U.S. Cl. .................. 438/790; 438/637; 438/780

(58) Field of Classification Search ................. 438/790, 438/637, 780

See application file for complete search history.

(56) References Cited

U.S. PATENT DOCUMENTS 6,365,968 B1 * 4/2002 Qian et al. ................. 257/739
2003/0015342 A1 * 1/2003 Sakamoto et al. .......... 174/250

OTHER PUBLICATIONS

S. Lee et al. "New Approach for Pattern Collapse Problem by Increasing Contact Area at Sub-100nm Patterning," Proc. SPIE—The International Society for Optical Engineering, Jun. 2003, pp. 166-174 (vol. 5039).

* cited by examiner

*Primary Examiner*—Thanh Nguyen
(74) *Attorney, Agent, or Firm*—Daryl Neff; Todd M. C. Li

(57) ABSTRACT

A method is provided for preparing a substrate for photolithographic patterning. The method includes providing a substrate having at least an exposed rough surface layer including a polymeric material. The rough surface layer has surface features characterized by feature step height varying between about two percent and twenty percent of the minimum photolithographic half-pitch. A layer of photoresist material is then provided over the exposed rough surface layer and patterned.

14 Claims, 2 Drawing Sheets

METHOD TO REDUCE PHOTORESIST PATTERN COLLAPSE BY CONTROLLED SURFACE MICROROUGHENING

BACKGROUND OF INVENTION

The present invention relates to photolithography.

As the size of devices is made smaller with each successive generation of microelectronics, the thickness of a photoresist layer used in patterning features of the devices is typically reduced. This is so for a variety of reasons, including the need to compensate for reduced control over the photolithographic depth of focus and reduced depth to which the photolithographic dose is absorbed at shorter wavelengths. However, a primary reason for the reduction of the photoresist thickness is avoidance of pattern collapse in the imaged photoresist layer. A well-known mechanism causing the collapse of photoresist patterns is loss of adhesion between the photoresist patterns and an underlying layer on which they are formed. The underlying layer is frequently a substrate or a layer of a substrate which consists essentially of a polymeric material. Such polymeric material layer is generally utilized as an antireflective coating (ARC).

Generally, the thickness of the photoresist layer is determined as a fixed multiple of the smallest size of a feature to be imaged in the photoresist layer. Stated another way, the photolithography process places a maximum value on the aspect ratio of photoresist patterns, the aspect ratio being the height of a patterned feature in a photoresist layer to the minimum width of the patterned feature. For photoresists sensitive to both i-line and deep ultra-violet wavelength (DUV) sources, the maximum aspect ratio was maintained at approximately 3.5 over several generations of shrinking feature sizes. For photoresists sensitive to 193 nm sources, the maximum aspect ratio has been maintained at approximately 3.0. However, for photoresists sensitive to 193 nm with higher effective numeric apertures and 157 nm sources, the avoidance of pattern collapse may require the maximum aspect ratio to decrease to an even lower value of about 2.0 to 2.5. Given that the size of features are shrunk even further for sub 130 nm node technologies, the reduced aspect ratio means that the height of the photoresist patterns is drastically reduced from what it was only a few years before.

As a result, in order to avoid pattern collapse, the photoresist thickness is reduced drastically, sometimes at the expense of other processing parameters. At such reduced photoresist thickness, one or the other of the following responses would be required, if a conventional approach were employed. One response would be to greatly increase the selectivity of the etch process to the patterned photoresist material, an achievement which is difficult to accomplish. Another way would be to utilize additional films, e.g. hardmask layers, for use with the patterned photoresist layer in sequentially transferring the pattern to underlying layers, a solution, while workable, which results in increased process complexity.

Therefore, it would be desirable to provide a method of avoiding collapse of photoresist patterns, which does not require the height of the patterns to be constrained to the same degree as conventionally practiced.

In addition, it would be desirable to provide a method of preparing a substrate for photolithographic patterning without requiring the selectivity of etch processes to be significantly increased and without having to utilize multiple films for sequential pattern transfer.

SUMMARY OF INVENTION

A method is provided for preparing a substrate for photolithographic patterning. The method includes providing a substrate having at least an exposed rough surface layer including a polymeric material. The rough surface layer has surface features characterized by feature step height varying between about two percent and twenty percent of the minimum photolithographic half-pitch. A layer of photoresist material is then provided over the exposed rough surface layer.

DETAILED DESCRIPTION

According to the embodiments of the invention, improved methods for preparing a substrate for photolithographic patterning and methods of photolithographically patterning are provided in which a rough surface layer is provided, onto which a layer of photoresist material is deposited. The rough surface layer improves adhesion of the photoresist material, such that the risk is reduced that subsequently formed photoresist patterns will collapse.

Figure 1:
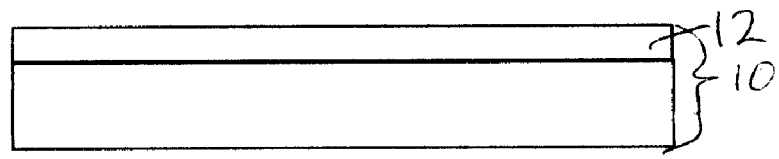
FIG. 1 illustrates an initial stage in preparing a substrate for photolithographic patterning in a method according to an embodiment of the invention.
Figure 2:
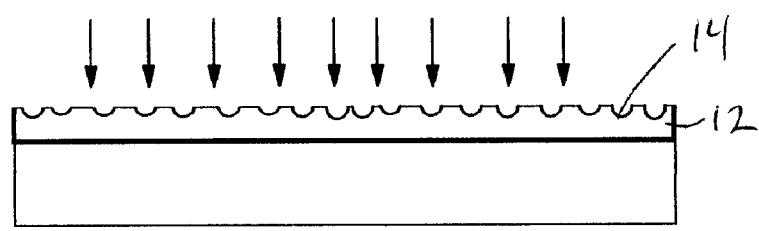
FIG. 2 illustrates a subsequent stage in preparing the substrate for photolithographic patterning following the stage illustrated in FIG. 1.

The substrate is prepared for photolithographic patterning by forming a roughened surface layer consisting essentially of a polymeric material such as an anti-reflective coating (ARC). According to some embodiments of the invention, a layer of polymeric material 12 is formed over a substrate 10, as shown in FIG. 1, and the layer 12 is roughened by subsequent processing to exhibit topography including surface features 14, as shown in FIG. 2.

For many photolithography processes, ARC is needed for good imaging of the photoresist material. Therefore, the presence of the ARC does not represent an additional material layer, but rather a layer already incorporated into a process, which is modified to provide improved adhesion of the overlying photoresist material. By roughening the surface of the ARC prior to depositing the photoresist material, the effective surface area of the interface between the photoresist material and the ARC is increased. The increased surface area, in turn, provides increased contact between the photoresist material and the ARC, increasing the adhesion between the two for a given size of pattern. As a result, the risk decreases that a photoresist pattern of the given size will collapse.

The process of roughening the ARC layer prior to depositing the photoresist layer is referred to herein as a "microroughening" process because of the size of the roughened surface features that result from the roughening process in relation to the sizes of the subsequently formed photoresist patterns. As the utility of embodiments of the invention described are expected to be high for front-end-of-line (FEOL) processing of advanced technology integrated circuits utilizing having small ground rules ranging from 130 nm and below, the surface features produced by such microroughening processes are characterized by heights varying between about two percent and twenty percent of the minimum photolithographic half-pitch. It is evident that the microroughening process must result in some minimum height of the topography in order for the roughened surface to be apparent on the scale of the molecules of the photoresist; hence, the origin of the minimum height of surface features. In addition, the microroughening process must not result in surface features exceeding a stated maximum height; otherwise, step changes in topography could actually lead to increased loss of adhesion by photoresist patterns, and lead to greater rather than reduced pattern collapse. Accordingly, a rule of thumb for a maximum height of features in the microroughened surface is that they not be greater than about twenty percent of the minimum lithographic half-pitch when photolithographically patterning minimum dimensioned features by the techniques described herein.

It is recognized that the sizes of surface features are distributed over a range of heights, such that the bulk of the surface features have heights falling within the stated range, while a small number of surface features have heights that are either higher than or lower than the stated range. It is intended by defining such range of variation to encompass all such distributions of feature heights, whether or not a small number of features have heights falling outside of the stated range.

Figure 3:
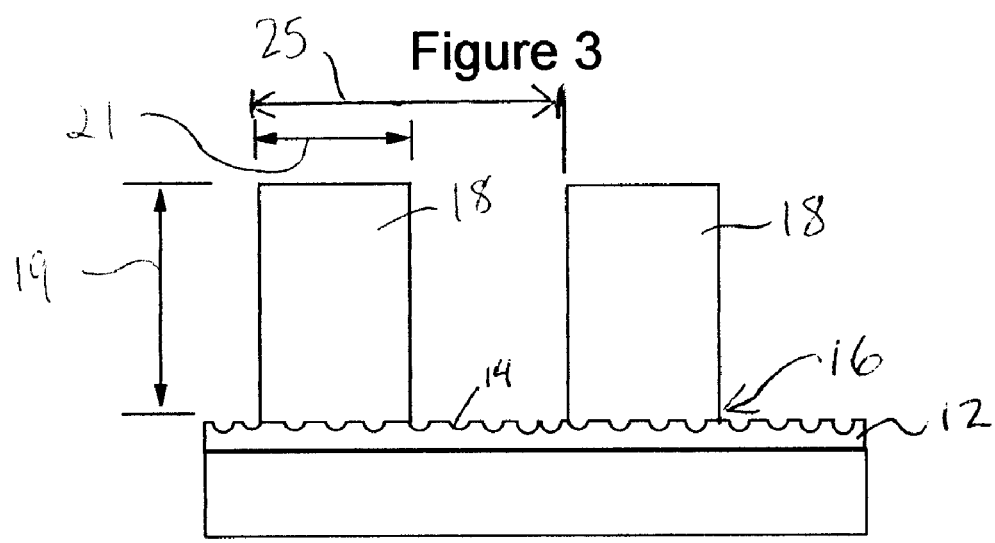
FIG. 3 illustrates a subsequent stage in which photoresist patterns have been formed over a prepared substrate in a method according to an embodiment of the invention.

As shown in FIG. 3, ideally, the features 14 of the microroughened surface are uniformly, albeit randomly, distributed throughout the interface 16 between the ARC 12 and the photoresist material 18, and in such manner that the optical properties of the ARC are not intolerably degraded. The aspect ratio of the photoresist patterns 18 are determined by the ratio of the height 19 of each pattern 18 to the width 21 of each pattern 18. The width of each pattern, in turn, is determined by the photomask that is used. The width may be as small as the minimum photolithographic half pitch that is selected for the particular generation of integrated circuit manufacturing when using a standard photomask, or may be even smaller, when a phase-shifting photomask is used.

According to a particular embodiment of the invention, a polymeric layer is roughened prior to depositing the photoresist material by a physical removal technique such as mechanical milling, ion milling or plasma sputtering, using species of noble gases and/or other gases that essentially do not chemically react with the material of the polymeric layer under the sputtering conditions. The goal of such embodiment is to form craters in the surface of the polymeric layer while only minimally chemically etching the layer, i.e. etching at a rate of less than 500 Å/min., or not at all. Typically, craters that are formed as a result of this process range between 10 nm and 100 nm in width and depth, depending upon the bias in the etch tool.

Such sputtering conditions can be achieved in a capacitively coupled plasma etcher. Examples of feed gases to the chamber include the noble gases argon (Ar), helium (He), and krypton (Kr), and gases which only minimally promote etching of organic polymer materials, such as bromine (Br), nitrogen ($N_2$) and hydrogen ($H_2$), and any combination thereof.

An example of a process conditions for forming craters in the surface of the polymeric material is as follows. A flow of Ar is provided to a chamber at a rate of 10 to 500 standard cubic centimeters per minute (sccm), a gas pressure between about 10 and 200 milliTorr (mT), optional magnetic plasma confinement at a strength of between about 20 and 60 Gauss, radio frequency (RF) power between about 400 and 1200 watts (W), at direct current (DC) biases between about 200 and 300 volts (V). By varying the RF power and DC bias conditions, the diameter and depth of the craters produced in the polymeric layer can be varied to meet a particular design point for surface roughness.

In addition to a capacitively coupled plasma etcher, other plasma generation techniques can be utilized to achieve a similarly controlled physical sputtering plasma for producing a cratered surface of a polymeric layer. Among such techniques are dual frequency capacitively coupled plasma etching, inductively coupled plasma etching, and low energy electron and/or ion beams. Process parameters for utilizing such alternative techniques vary accordingly.

According to another embodiment of the invention, the polymeric layer is roughened by a process involving the simultaneous removal of material from the surface by ion milling or plasma sputtering, and chemical etching of the surface of the polymeric layer. The ion milling/plasma sputtering aspect of the process results in the formation of "fine grains" on the surface of the polymeric layer. Fine grains that form as a result of this process typically have a shape similar to a peanut and range in width between 5 nm and 30 nm. The fine grains effectively provide both constructive and additive topography to the surface on the order of 5 nm to 50 nm.

According to this embodiment, the chemical etching aspect of the process is limited to a level of 2000 to 3000 Å/min., such that it only assists in forming a heightened topography. The predominant removal technique is physical sputtering. Such process can be achieved by capacitively coupled plasma etching in which one or more fluorides of carbon (e.g. $CF_4$, $CF_3$), and/or sulfur hexaflouride ($SF_6$) are present, either alone or in combination with a noble gas such as Ar, He, or Kr or a combination thereof.

An example of process conditions for forming fine grains to roughen the surface of the polymeric material is as follows. The flow of one or more of the above-indicated gases is provided to the chamber at a rate of 10 to 500 sccm at a gas pressure between about 10 and 200 milli-Torr (mT), optional magnetic plasma confinement at a strength of between about 20 and 60 Gauss, and RF power between about 400 and 1200 W, DC bias ranging between about 350 and 700 V.

Variation of the process conditions produces different results in the quality of the microroughened surface. By varying the RF power from 300 to 1200 W and DC bias conditions from 250 to 700 V, the following changes result in the surface topography: the etch rate of the polymeric layer increases; the degree of surface roughness increases; and "craters" or "pits" formed in the surface are partially smoothed by the deposition of a polymer-like residue from the etching. In addition, the width of the crater-void is decreased. Deposition of the polymer-like residue during the etching over the unetched top layer of the polymer results in fine, typically peanut-shaped grains, adding topography to the surface ranging in height from a few nanometers to 50 nm. In addition, the spatial periodicity of the grains increases, e.g. from 10 nm to 200 nm.

As in the above-described embodiment, other etching techniques can be used to achieve the desired surface roughening provided by this embodiment, among which are dual frequency capacitively coupled plasma etching, inductively coupled plasma etching, and low energy electron and/or ion beams. Again, process parameters for utilizing such alternative techniques will vary accordingly.

Figure 4:
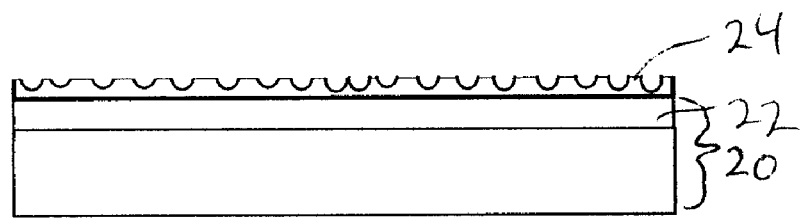
FIG. 4 illustrates a stage in a method of preparing a substrate for photolithographic patterning according to an alternative embodiment of the invention.

According to yet another embodiment as illustrated with reference to FIG. 4, a microroughened polymeric layer is achieved by simultaneously depositing a polymeric layer 24 and performing ion milling and/or plasma sputtering of the layer 24, the layer 24 being deposited onto a pre-existing layer 22 of the substrate 20. In depositing the polymeric layer according to such embodiment, very little or no chemical etching is conducted, i.e., any etching proceeds at a rate of less than about 500 Å/min., which predominantly occurs in the deposited polymeric layer. Such processing can be achieved by capacitively coupled plasma etching techniques in which fluorides of hydrocarbons (e.g., $CHF_3$, $CH_2F_2$) and/or larger molecular weight carbon fluoride gases (e.g. $C_4F_8$) are present, either individually, or in combination with one or more noble gases (e.g. Ar, He or Kr) or any combination thereof.

The following is an example of process conditions for depositing a microroughened surface polymeric layer according to this embodiment of the invention. A gas or combination of gases including $CHF_3$ or $C_4F_8$ and Ar, for example, are provided to a capacitively coupled plasma etcher chamber at a flow rate between about 10 and 500 sccm, gas pressure from between about 10 and 200 mT, optional magnetic confinement from between about 20 and 60 Gauss, and RF plasma generating power between about 400 and 1200 W. Processing according to this embodiment results in a deposited polymeric layer having an additive microroughened surface having few, if any, craters or grains in the surface, and only added topography from the deposited polymeric layer.

Again, as in the above-described embodiment, other etching techniques can be used to achieve the desired surface roughening provided by this embodiment, among which are dual frequency capacitively coupled plasma etching, inductively coupled plasma etching, and low energy electron and/or ion beams.

The foregoing described processes can be referred to as subtractive processes because the topography of the polymeric underlayer results from the removal of material from the surface of that layer. According to yet another embodiment of the invention, a process is provided which is "additive," rather than subtractive, in that surface topography is created by the addition of particles to the surface of the polymeric layer, rather than the removal of material from the surface. According to such embodiment, a multiplicity of small particles known as "nanoparticles", "nanospheres" or "nanoclusters" having diameters generally less than about 10 nm are added to the surface of the polymeric material layer such that the particles jut up from the surface.

This is accomplished according to one of two ways. One way is to incorporate nanoparticles into a polymeric surface layer during deposition of the layer. Another way is to deposit the nanoparticles onto an existing polymeric surface layer to provide a roughened surface layer. Preferably, the nanoparticles are essentially inert, i.e. nonreactive to materials incorporated in the polymeric layer, and/or the photoresist layer and/or chemicals used to develop or rinse the developed photoresist layer that is formed over the roughened polymeric layer.

The pitch 25 of the patterns 18 formed in the photoresist layer (FIG. 3) affects the degree of surface adhesion that is achieved for photoresist patterns of a particular depth, all other factors being equal. Accordingly, tightly pitched resist line patterns 18 have a greater need for improved surface adhesion, while resist line patterns having asymmetric pitch (i.e. nested on one side only and open on the other side) have an even greater need for improved surface adhesion as the risk of collapse is greater for such case.

The particular surface topography achieved in the surface layer underlying the photoresist layer affects the strength of adhesion between the two layers. Thus, features having sharp step heights provide greater mechanical interlocking of the layers than features that have a continuous, e.g. spherical, shape.

Figure 5:
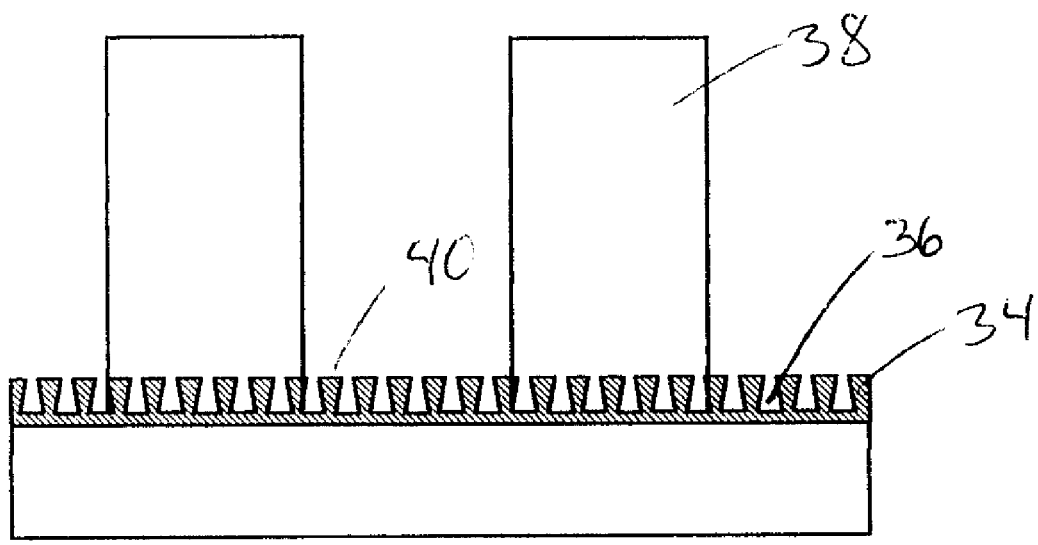
FIG. 5 illustrates a stage in a method of photolithographic patterning according to an embodiment of the invention in which a polymeric surface layer has a retrograde profile which interlocks with subsequently formed photoresist patterns.

FIG. 5 illustrates a particular preferred embodiment of the invention in which the polymeric surface layer 34 underlying the photoresist material 38 has a retrograde profile in which openings 36 in the surface 40 of the polymeric surface layer 34 grow larger with increasing depth from the surface 40. Such retrograde profile results in increased adhesion of the photoresist material 38, because the photoresist material mechanically interlocks with the underlying retrograde openings in the polymeric layer in a manner similar to that of a dovetail joint in carpentry. Increased adhesion results relative to that of the embodiment shown in FIG. 4 because the photoresist material can only detach from the underlying retrograded surface layer by shearing off the surface features of the underlying retrograded layer. A retrograde surface profile in this manner can be achieved, for example, through wet etching the surface layer while retarding etching of the surface itself through use of a surface inhibitor. A standard, widely available adhesion promoter such as hexamethyldisilazane (HMDS) is suitable for this purpose.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of preparing a substrate for photolithographic patterning, comprising:

providing a substrate having at least an exposed rough surface layer including a polymeric material, said surface layer having surface features characterized by feature step height varying between about two percent and twenty percent of the minimum photolithographic half-pitch, wherein said surface layer has a multiplicity of openings having a retrograde profile, each of said multiplicity of retrograde profile openings growing larger with increasing depth from an exposed surface of said surface layer; and depositing a layer of photoresist material in contact with said multiplicity of retrograde profile openings of surface layer such that said layer of photoresist material interlocks with said multiplicity of retrograde profile openings.

2. A method as claimed in claim 1, further comprising forming said surface layer having said multiplicity of retrograde profile openings by depositing a polymeric material layer and etching said polymeric material layer with an etchant in presence of an adhesion promoter, said etchant attacking an exposed surface of said polymeric material layer less rapidly than said polymeric material layer below said exposed surface to form said multiplicity of retrograde profile openings.

3. A method as claimed in claim 1 wherein said polymeric material layer is an anti-reflective coating (ARC).

4. A method as claimed in claim 1, further comprising forming said surface layer by processing including simultaneously performing at least one of ion milling and plasma sputtering to a polymeric material layer and chemically etching said polomeric material layer.

5. A method as claimed in claim 4 wherein said processing is performed in an ambient including at least one gas selected from fluorides of carbon, sulfur fluoride, and noble gases.

6. A method as claimed in claim 1, further comprising photolithographically patterning said layer of photoresist material into photoresist patterns, at least some of which have photolithographic half-pitch of less than about 110 nm and a height-to-width aspect ratio of greater than about two and one half.

7. A method as claimed in claim 1, wherein said surface layer incorporates a multiplicity of nanoparticles providing roughness to said surface layer.

8. A method as claimed in claim 7, wherein said multiplicity of nanoparticles are essentially inert.

9. A method as claimed in claim 8 wherein said multiplicity of nanoparticles are deposited onto a layer of said polymeric material to provide said surface layer.

10. A method as claimed in claim 1, wherein said multiplicity of nanoparticles are incorporated while said surface layer is deposited.

11. A method as claimed in claim 2, wherein said adhesion promoter includes hexamethyldisilazane ("HMDS") and said adhesion promoter acts as a surface inhibitor during said etching of said surface layer.

12. A method of providing improved photolithographic patterning having reduced risk of pattern collapse, comprising:
providing a substrate having at least an exposed rough surface layer including a polymeric material having surface features characterized by feature step height varying between about two percent and twenty percent of 110 nm or less, wherein said surface features include a multiplicity of openings having a retrograde profile, each of said multiplicity of retrograde profile openings growing larger with increasing death from an exposed surface of said surface layer;
depositing a layer of photoresist material in contact with said retrograde profile openings of said exposed rough surface layer such that said layer of photoresist material interlocks with said multiplicity of retrograde profile openings;
photolithographically patterning said photoresist material layer into photoresist patterns, wherein at least some of said photoresist patterns have a photolithographic half-pitch of less than about 110 nm and a height-to-width aspect ratio of greater than about two and one half; and
etching a portion of said underlying layer exposed by said photoresist patterns.

13. A method of photolithographically patterning a layer of a substrate, comprising:
providing an exposed rough surface layer over an underlying layer of said substrate, said surface layer including a polymeric material having surface features characterized by a step height varying between about two percent and twenty percent of the minimum photolithographic half-pitch, wherein said surface features include a multiplicity of openings having a retrograde profile, each of said multiplicity of retrograde profile openings growing larger with increasing depth from an exposed surface of said surface layer;
depositing a layer of photoresist material in contact with said multiplicity of retrograde profile openings of said exposed rough surface layer such that said layer of photoresist material interlocks with said multiplicity of retrograde profile openings;
photolithographically patterning said photoresist material layer into photoresist patterns; and
etching a portion of said underlying layer exposed by said photoresist patterns.

14. A method as claimed in claim 13 wherein at least some of said photoresist patterns have photolithographic half-pitch of less than about 110 nm and a height-to-width aspect ratio greater than about two and one half.

* * * * *